(12) United States Patent
Watanabe et al.

(10) Patent No.: US 12,002,910 B2
(45) Date of Patent: Jun. 4, 2024

(54) DISPLAY DEVICE

(71) Applicant: SONY CORPORATION, Tokyo (JP)

(72) Inventors: Toshihiko Watanabe, Tokyo (JP); Jun Suzuki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 489 days.

(21) Appl. No.: 17/281,011

(22) PCT Filed: Sep. 9, 2019

(86) PCT No.: PCT/JP2019/035334
§ 371 (c)(1),
(2) Date: Mar. 29, 2021

(87) PCT Pub. No.: WO2020/075431
PCT Pub. Date: Apr. 16, 2020

(65) Prior Publication Data
US 2021/0343911 A1 Nov. 4, 2021

(30) Foreign Application Priority Data
Oct. 9, 2018 (JP) ................. 2018-190984

(51) Int. Cl.
H01L 33/58 (2010.01)
H01L 27/15 (2006.01)
H01L 33/62 (2010.01)

(52) U.S. Cl.
CPC ............ H01L 33/58 (2013.01); H01L 27/156 (2013.01); H01L 33/62 (2013.01)

(58) Field of Classification Search
CPC ....... H01L 33/58; H01L 27/156; H01L 33/62; H01L 25/0753
See application file for complete search history.

(56) References Cited

U.S. PATENT DOCUMENTS

| | | | |
|---|---|---|---|
| 2008/0224153 A1 | 9/2008 | Tomoda | |
| 2014/0077682 A1* | 3/2014 | Ho | H05B 33/02 313/110 |
| 2015/0171372 A1* | 6/2015 | Iwata | H10K 50/854 257/89 |
| 2018/0088379 A1 | 3/2018 | Fan | |
| 2019/0049599 A1 | 2/2019 | Matsumoto et al. | |

FOREIGN PATENT DOCUMENTS

| | | |
|---|---|---|
| CN | 101197355 A | 6/2008 |
| CN | 103680335 A | 3/2014 |
| CN | 105629576 A | 6/2016 |
| CN | 108604591 A | 9/2018 |
| JP | 2004-200236 A | 7/2004 |

(Continued)

OTHER PUBLICATIONS

International Search Report and Written Opinion of PCT Application No. PCT/JP2019/035334, dated Nov. 5, 2019, 10 pages of ISRWO.

*Primary Examiner* — Douglas W Owens
(74) *Attorney, Agent, or Firm* — CHIP LAW GROUP

(57) ABSTRACT

A display device that includes a plurality of light-emitting elements, a first light-absorbing layer having an opening at a position that faces the light-emitting elements, and a second light-absorbing layer that faces the first light-absorbing layer with the light-emitting elements therebetween.

9 Claims, 10 Drawing Sheets

(56) References Cited

FOREIGN PATENT DOCUMENTS

| | | |
|---|---|---|
| JP | 2008-141026 A | 6/2008 |
| JP | 2014-060320 A | 4/2014 |
| JP | 2016-192434 A | 11/2016 |
| KR | 10-2008-0051044 A | 6/2008 |
| TW | 200837819 A | 9/2008 |
| WO | 2017/145578 A1 | 8/2017 |
| WO | 2017/166332 A1 | 10/2017 |

* cited by examiner

[ FIG. 1 ]
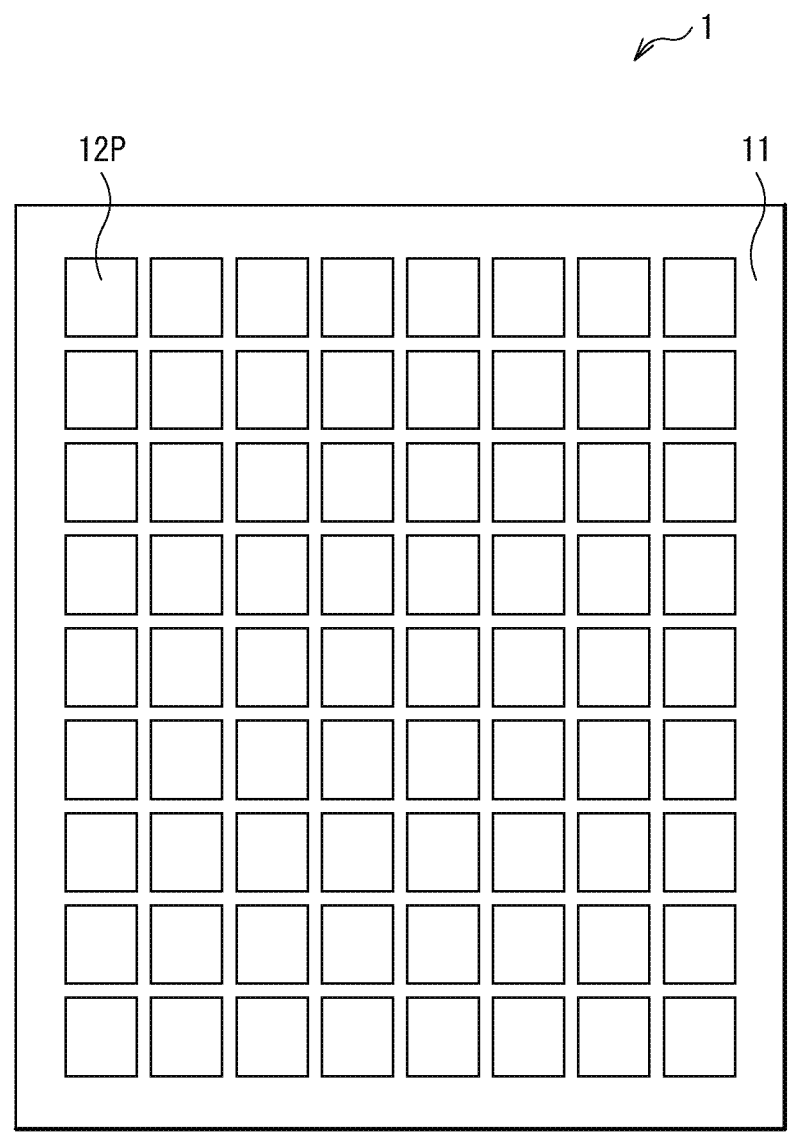

[ FIG. 2 ]
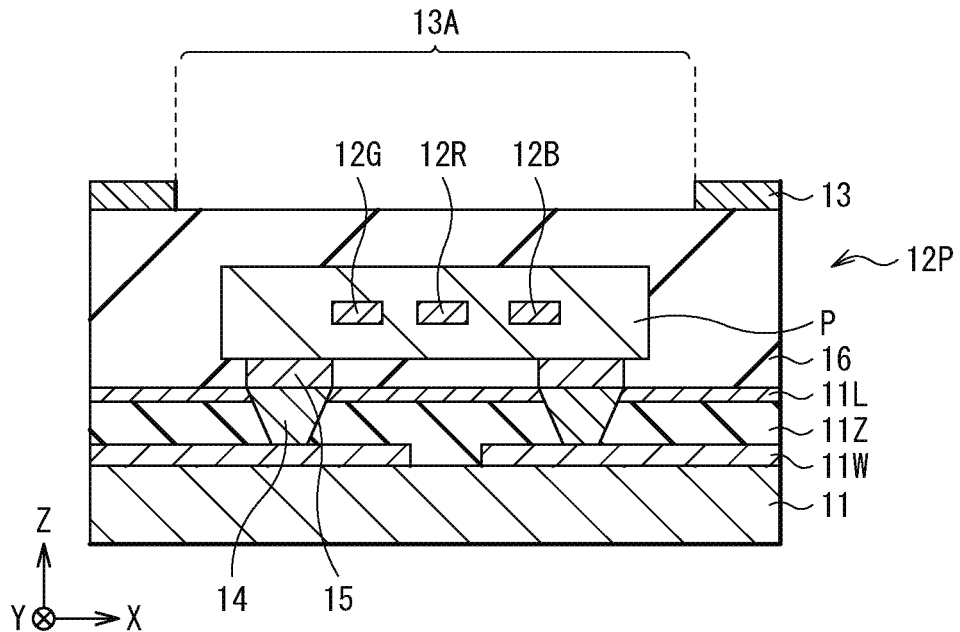
[ FIG. 3A ]
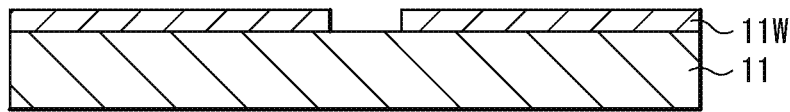
[ FIG. 3B ]
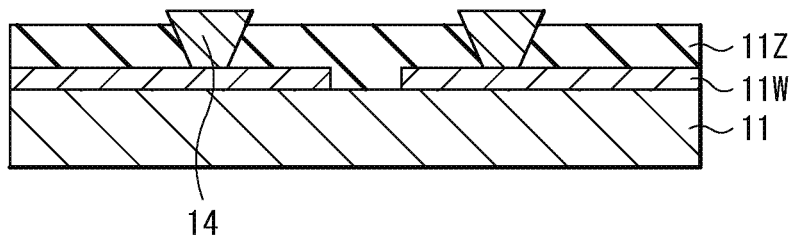
[ FIG. 3C ]
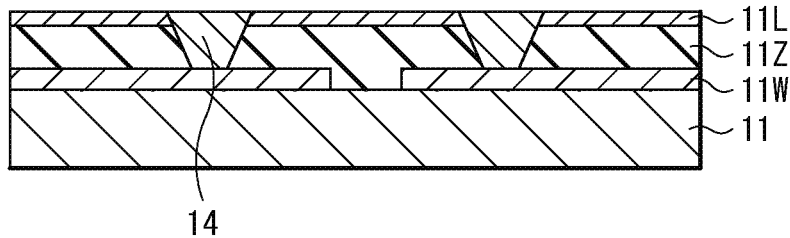

[ FIG. 4A ]
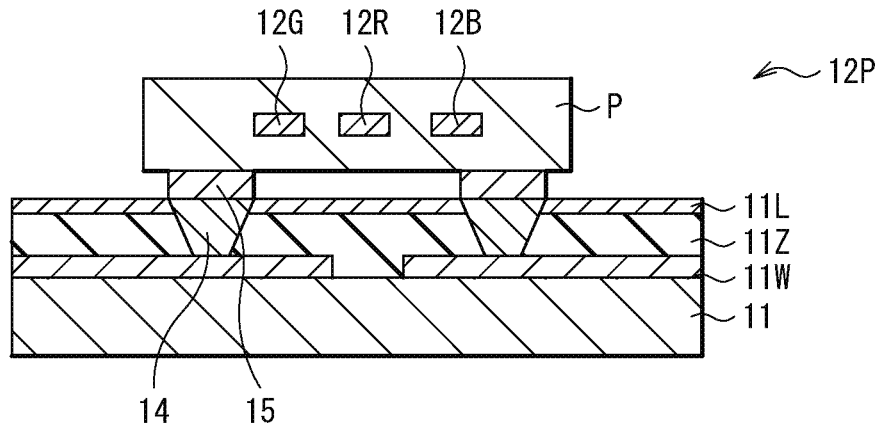
[ FIG. 4B ]
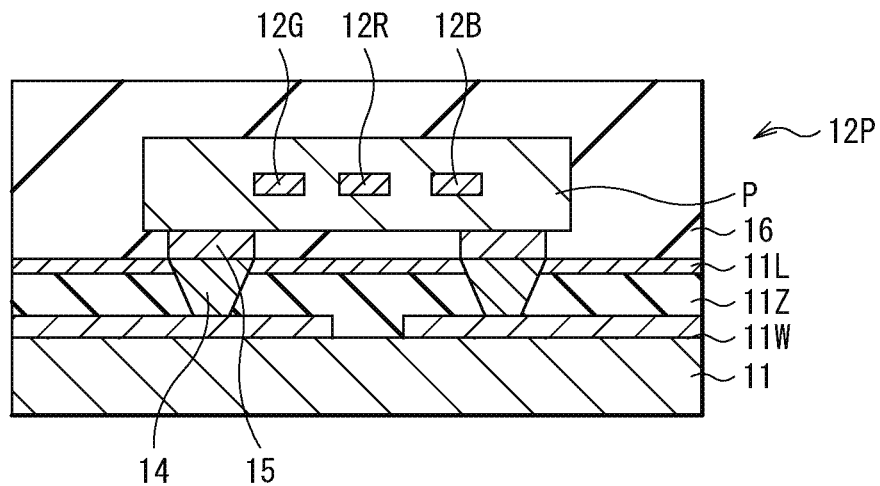
[ FIG. 5 ]
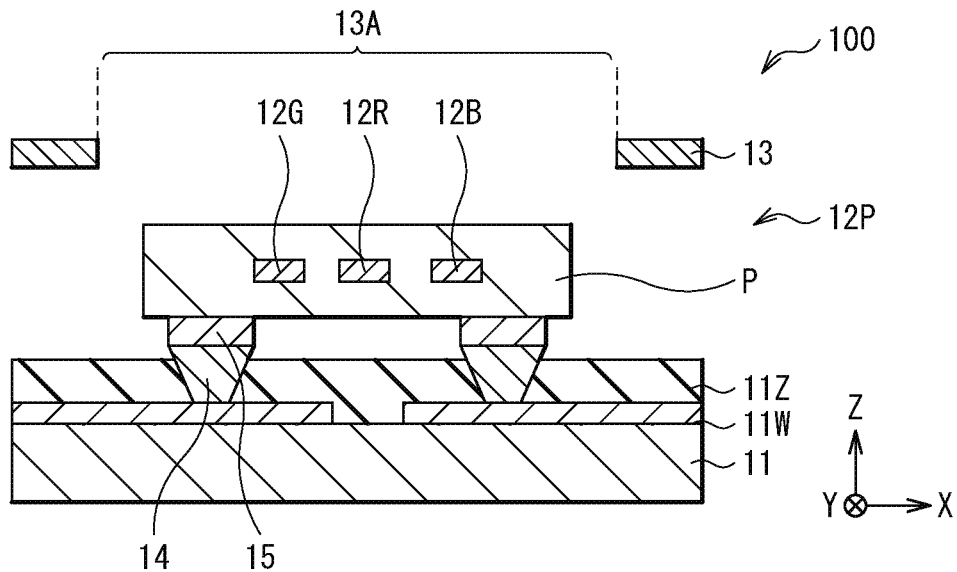

[FIG. 6]
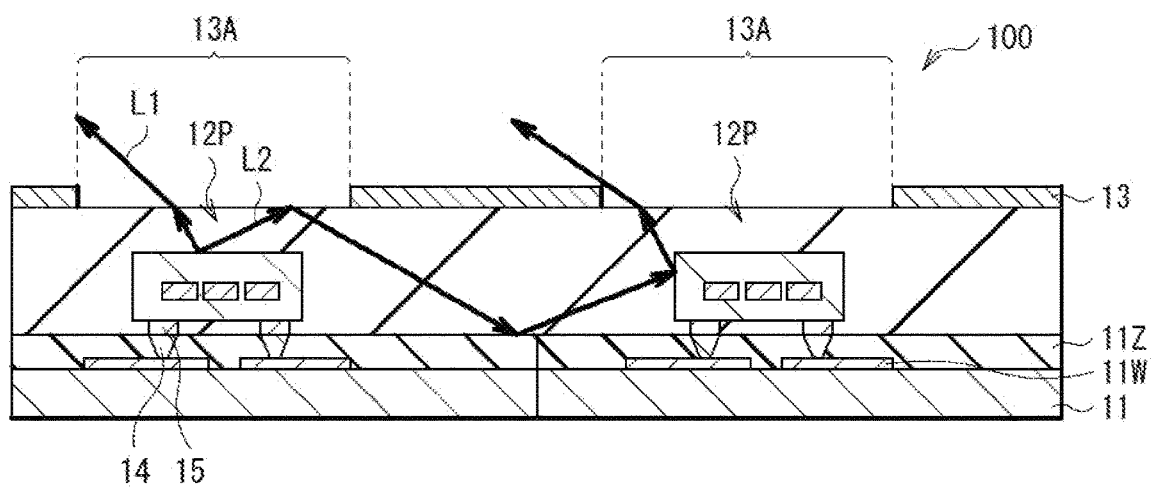
[FIG. 7]
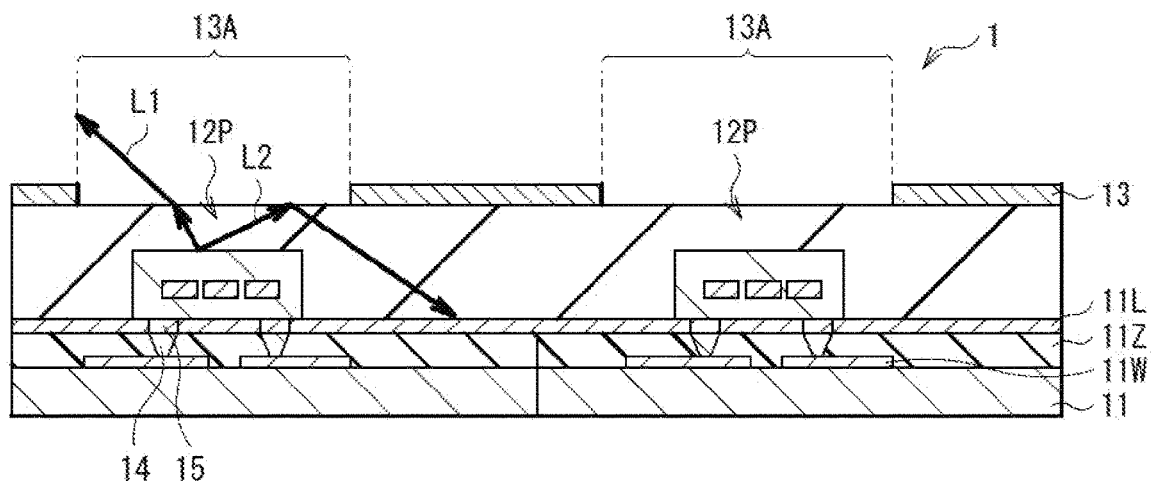

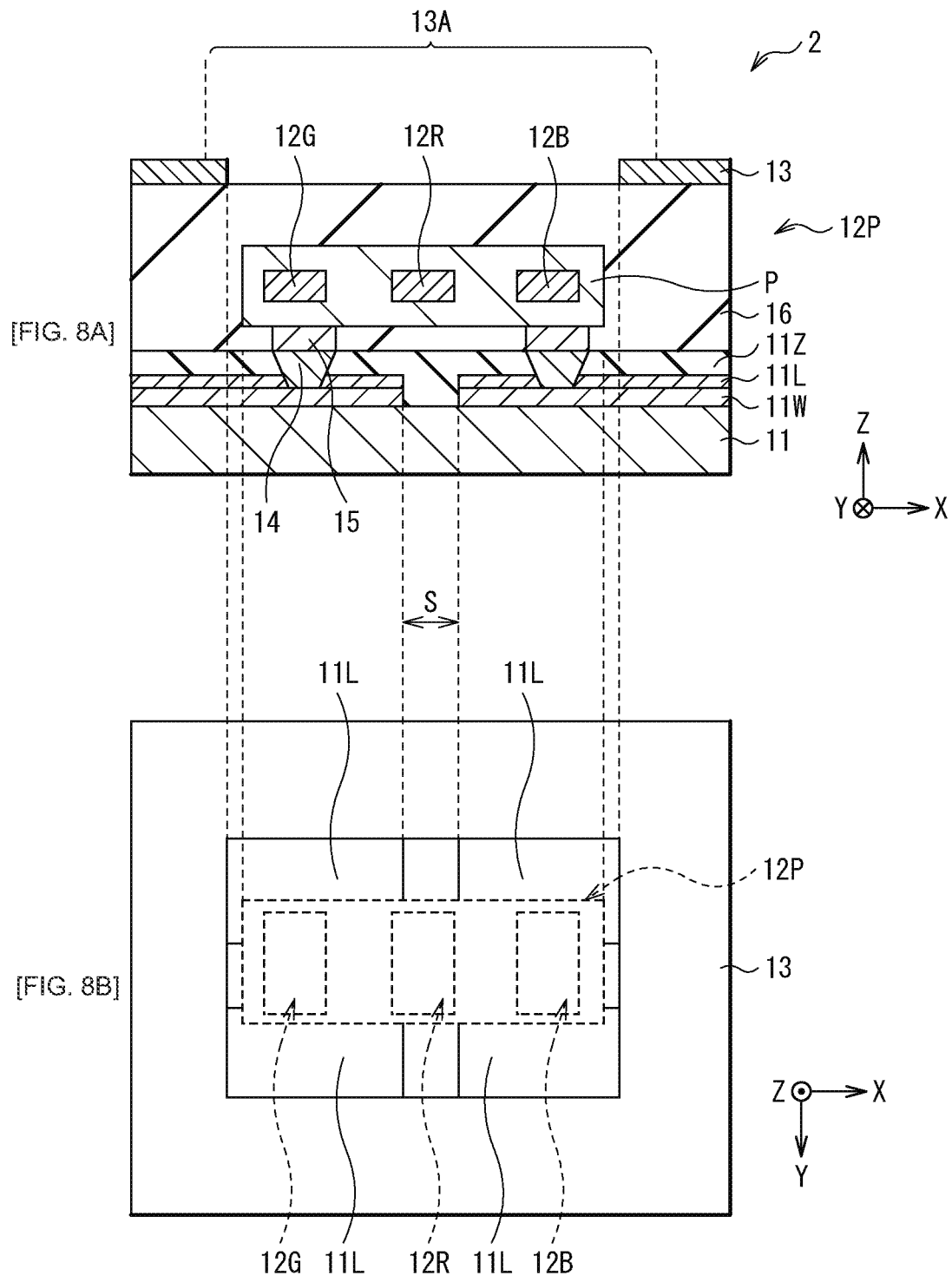

[ FIG. 9A ]
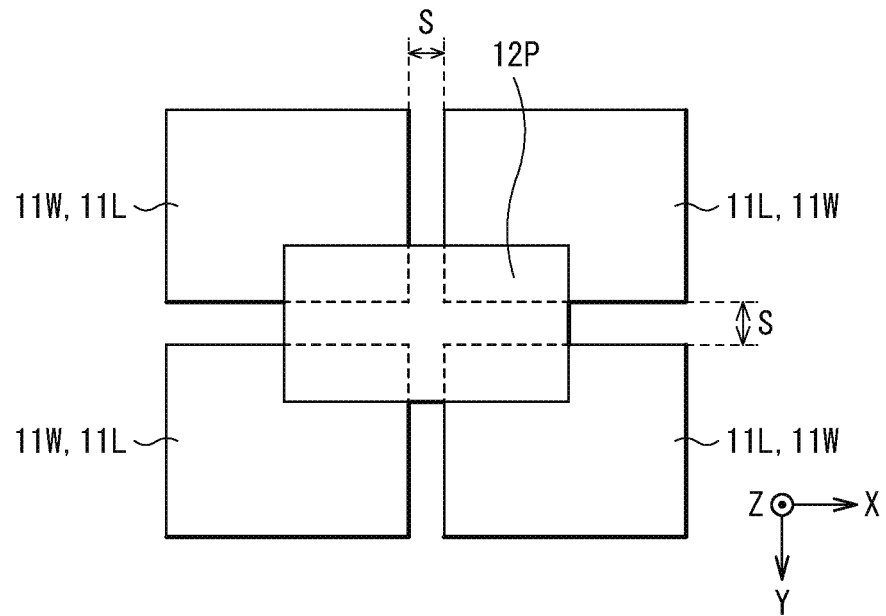
[ FIG. 9B ]
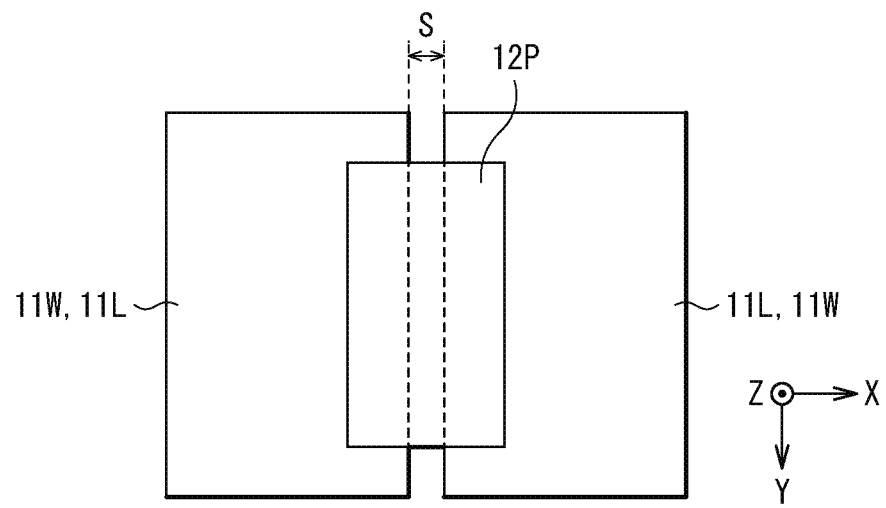

[ FIG. 10 ]
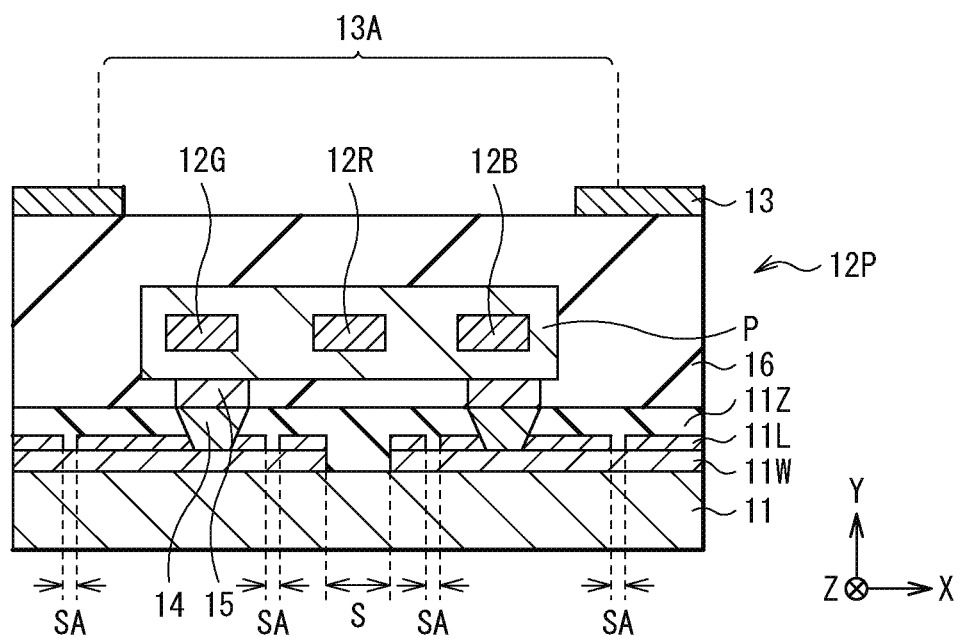
[ FIG. 11 ]
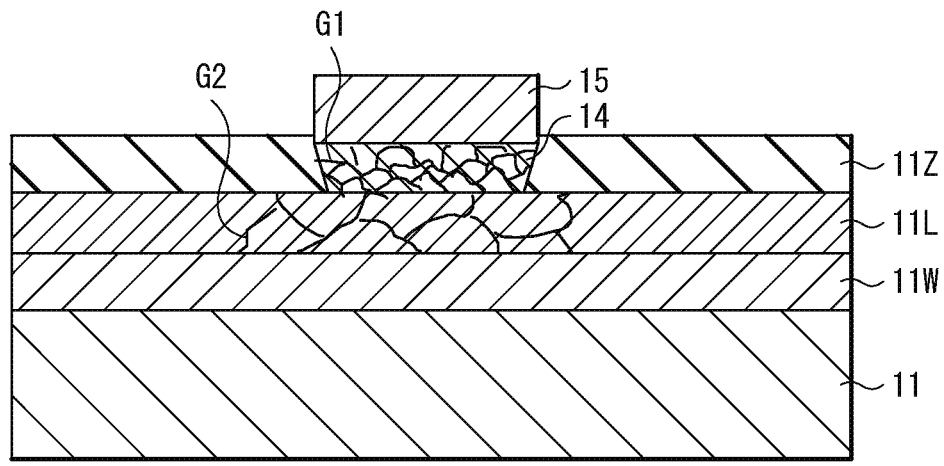

[ FIG. 12A ]
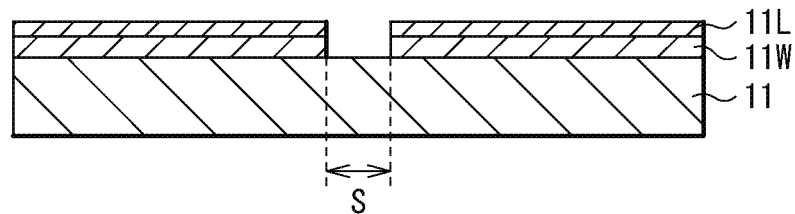
[ FIG. 12B ]
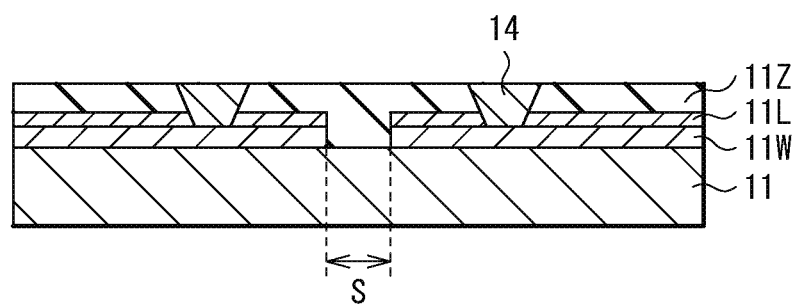

[ FIG. 13A ]
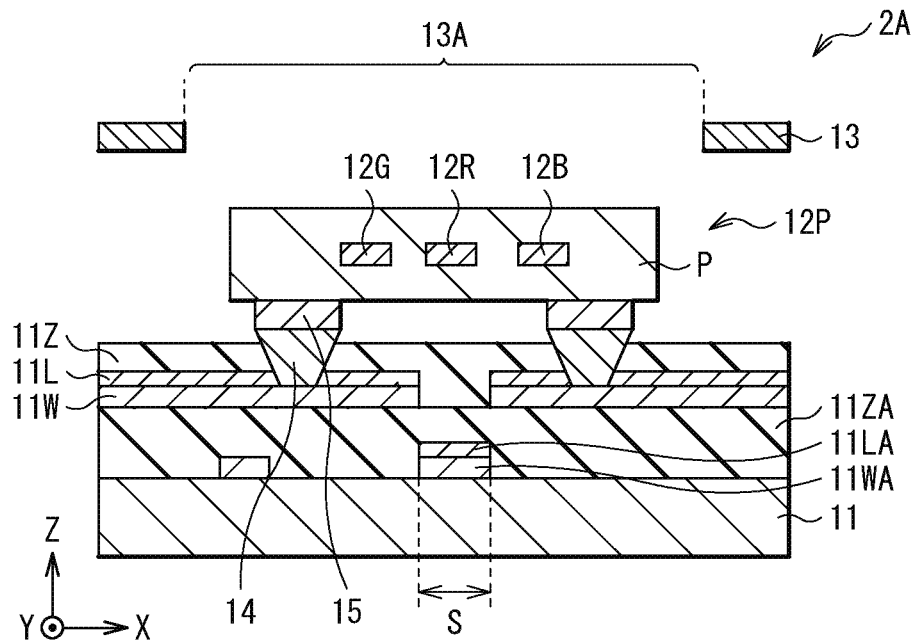
[ FIG. 13B ]
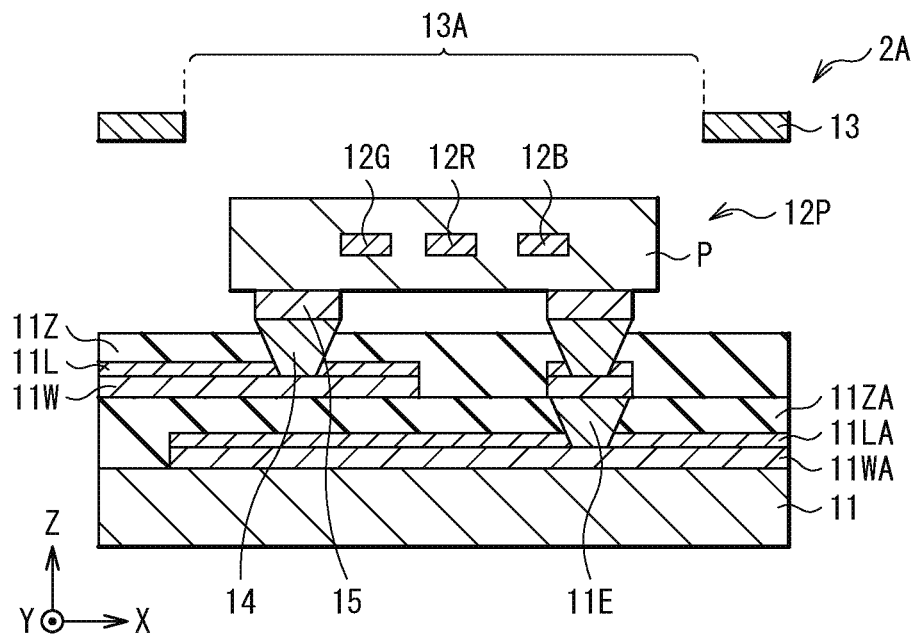

[ FIG. 14A ]
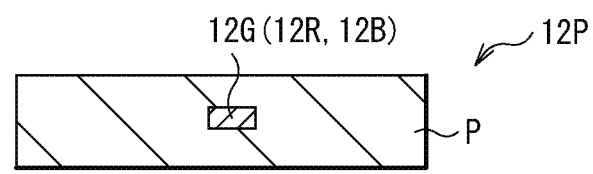
[ FIG. 14B ]
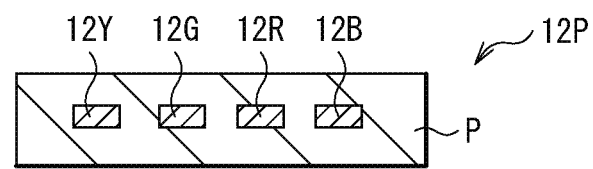

DISPLAY DEVICE

CROSS REFERENCE TO RELATED APPLICATIONS

This application is a U.S. National Phase of International Patent Application No. PCT/JP2019/035334 filed on Sep. 9, 2019, which claims priority benefit of Japanese Patent Application No. JP 2018-190984 filed in the Japan Patent Office on Oct. 9, 2018. Each of the above-referenced applications is hereby incorporated herein by reference in its entirety.

TECHNICAL FIELD

The present technology relates to a display device having a plurality of light-emitting elements.

BACKGROUND ART

A self-luminous display device that uses a light-emitting element such as a light-emitting diode (LED: Light Emitting Diode) has been developed (see, for example, Patent Literature 1). In such a display device, a light-absorbing layer is provided to suppress a reflection of light having a wavelength in a visible range.

CITATION LIST

Patent Literature

Patent Literature 1: Japanese Unexamined Patent Application Publication No. 2004-200236

SUMMARY OF THE INVENTION

In such a display device, it is desired to improve image quality.

Therefore, it is desirable to provide a display device that makes it possible to improve image quality.

A display device according to one embodiment of the present technology includes: a plurality of light-emitting elements; a first light-absorbing layer having an opening at a position that faces the light-emitting elements; and a second light-absorbing layer that faces the first light-absorbing layer with the light-emitting elements therebetween.

In the display device according to one embodiment of the present technology, the second light-absorbing layer is provided that faces the first light-absorbing layer with the light-emitting element therebetween. Hence, a reflection of light is suppressed on both sides of an upper layer and a lower layer of the light-emitting elements.

BRIEF DESCRIPTION OF THE DRAWINGS

FIG. 1 is a schematic diagram illustrating a schematic configuration of a display device according to a first embodiment of the present technology.

FIG. 2 is a schematic cross-sectional diagram illustrating a configuration of a main part of the display device illustrated in FIG. 1.

FIG. 3A is a schematic cross-sectional diagram illustrating a step of a method of manufacturing the display device illustrated in FIG. 2.

FIG. 3B is a schematic cross-sectional diagram illustrating a process following FIG. 3A.

FIG. 3C is a schematic cross-sectional diagram illustrating a process following FIG. 3B.

FIG. 4A is a schematic cross-sectional diagram illustrating a process following FIG. 3C.

FIG. 4B is a schematic cross-sectional diagram illustrating a process following FIG. 4A.

FIG. 5 is a schematic cross-sectional diagram illustrating a configuration of a main part of a display device according to a comparative example.

FIG. 6 is a schematic diagram for describing paths of light emitted from light-emitting elements illustrated in FIG. 5.

FIG. 7 is a schematic diagram for describing paths of light emitted from light-emitting elements illustrated in FIG. 2.

FIG. 8A is a schematic diagram illustrating a cross-sectional configuration of a main part of a display device according to a second embodiment of the present technology, and FIG. 8B is a schematic diagram illustrating a planar configuration of the display device illustrated in FIG. 8A.

FIG. 9A is a schematic diagram illustrating an example of a planar configuration of a gap illustrated in FIG. 8B.

FIG. 9B is a schematic diagram illustrating another example of the planar configuration of the gap illustrated in FIG. 9A.

FIG. 10 is a schematic cross-sectional diagram illustrating another example of the display device illustrated in FIG. 8A.

FIG. 11 is a schematic diagram for describing grains generated in UBM illustrated in FIG. 8A.

FIG. 12A is a schematic cross-sectional diagram illustrating a step of a method of manufacturing the display device illustrated in FIG. 8A.

FIG. 12B is a schematic cross-sectional diagram illustrating a step following FIG. 12A.

FIG. 13A is a schematic cross-sectional diagram illustrating a configuration of a main part of a display device according to a modification example.

FIG. 13B is a schematic cross-sectional diagram illustrating another example of the display device illustrated in FIG. 13A.

FIG. 14A is a schematic cross-sectional diagram illustrating another example (1) of a package illustrated in FIG. 2, etc.

FIG. 14B is a schematic cross-sectional diagram illustrating another example (2) of the package illustrated in FIG. 2, etc.

MODES FOR CARRYING OUT THE INVENTION

The following describes an embodiment of the present technology in detail with reference to the drawings. Note that the description will be made in the following order.

1. First Embodiment (a display device having a first light-absorbing layer and a second light-absorbing layer)
2. Second Embodiment (a display device having the second light-absorbing layer that is in contact with a wiring line layer)
3. Modification Example (an example in which a third light-absorbing layer is provided between a substrate and a wiring line layer)
4. Other Modification Examples (configuration examples of a package)

<First Embodiment>
(Configuration of Display Device 1)

FIG. 1 schematically illustrates an entire configuration of a display device (a display device 1) according to a first embodiment of the present technology. In this display device 1, for example, a plurality of packages 12P is provided on a substrate 11. The plurality of packages 12P is arranged in a matrix, for example.

FIG. 2 schematically illustrates a cross-sectional configuration of a main part of the display device 1. The display device 1 has a first light-absorbing layer 13 that faces the substrate 11 with the package 12P therebetween. The first light-absorbing layer 13 has openings 13A in regions that face the respective packages 12P. The package 12P includes, for example, three light-emitting elements (light-emitting elements 12R, 12G, and 12B) and a protector P that covers the light-emitting elements 12R, 12G, and 12B. Between the substrate 11 and the package 12, for example, a wiring line layer 11W, an insulating layer 11Z, and a second light-absorbing layer 11L are provided in this order from the substrate 11 side. Each of the plurality of packages 12P is coupled to the wiring line layer 11W via a solder layer 15 and UBM (Under Barrier Metal). The package 12 is covered with a protection layer 16, and the first light-absorbing layer 13 is provided on the protection layer 16.

The substrate 11 is for mounting the package 12P, and includes, for example, a glass substrate or a resin substrate.

The wiring line layer 11W provided on the substrate 11 is provided in a selective region on the substrate 11. One of the wiring line layer 11W coupled to the package 12P via the UBM 14 and the solder layer 15 is coupled to a p-type electrode (to be described later) of the light-emitting elements 12R, 12G, and 12B, and the other is coupled to an n-type electrode (to be described later). The wiring line layer 11W includes, for example, a metal material such as copper (Cu) or aluminum (Al). The metal material may be a single body, or may be an alloy. The wiring line layer 11W may include a light-transmitting, electrically conductive material such as ITO (Indium Tin Oxide).

The insulating layer 11Z is provided, for example, on the entire surface of the substrate 11 so as to cover the wiring line layer 11W. The insulating layer 11Z includes, for example, an organic insulating material or an inorganic insulating material. The insulating layer 11Z may have a stack structure including the organic insulating material and the inorganic insulating material. Examples of the organic insulating material include an acryl-based resin, an epoxy-based resin, and a polyimide-based resin. Examples of the inorganic insulating material include a silicon oxide (SiO), a silicon nitride (SiN), and a silicon oxynitride (SiON).

In the present embodiment, the second light-absorbing layer 11L is provided on the insulating layer 11Z, and the second light-absorbing layer 11L faces the first light-absorbing layer 13 with the package 12P therebetween. As will be described later in detail, this suppresses a reflection of light more effectively than a case where only the first light-absorbing layer 13 is provided.

The second light-absorbing layer 11L is provided over substantially the entire surface of the insulating layer 11Z, for example, and is disposed between the insulating layer 11L and the package 12P, or between the insulating layer 11L and the protection layer 16.

The second light-absorbing layer 11L may be provided in a selective region on the insulating layer 11Z. At this time, it is preferable that the second light-absorbing layer 11L be provided in a region that faces the opening 13A of the first light-absorbing layer 13, that is, a region including a region overlapping with the opening 13A in a plan (in an X-Y plane in FIG. 2) view. As a result, the wiring line layer 11W in the region that faces the opening 13A is covered with the second light-absorbing layer 11L. Accordingly, a reflection of light on a surface of the wiring line layer 11W exposed from the opening 13A of the first light-absorbing layer 13 is suppressed.

Such a second light-absorbing layer 11L includes, for example, a material having a high light absorptivity with respect to light of wavelengths emitted from the light-emitting elements 12R, 12G, and 12B, that is, light of wavelengths in the visible range. For example, the second light-absorbing layer 11L includes, for example, a resin material containing carbon black. The second light-absorbing layer 11L may include, for example, a metal material such as titanium (Ti), chromium (Cr), nickel (Ni), tungsten (W), or molybdenum (Mo). A thickness of the second light-absorbing layer 11L (a size in a Z direction in FIG. 2) is, for example, about 0.1 μm to 10 μm.

The UBM 14 is provided so as to be exposed from a surface of the second light-absorbing layer 11L, and is buried in a connection hole that penetrates the insulating layer 11Z. The second light-absorbing layer 11L has, for example, an opening section that exposes the UBM 14. The UBM 14 electrically couples the wiring line layer 11W and the solder layer 15. For example, four UBMs are coupled to one package 12P. The UBM 14 is, for example, formed using an electroless plating method, and has a stack structure in which nickel (Ni) and gold (Au) are provided in order from the wiring line layer 11W side. The UBM 14 may have, for example, a stack structure in which nickel (Ni), palladium (Pd), and gold (Au) are provided in order from the wiring line layer 11W side. The solder layer 15 is provided between the UBM 14 and the package 12P. The solder layer 15 includes, for example, a tin-silver (Sn—Ag) based material, a tin-silver-copper (Sn—Ag—Cu) based material, a tin-copper (Sn—Cu) based material, a tin-silver-bismuth (Sn—Ag—Bi) based material, or the like.

Each of the packages 12P is electrically coupled to the wiring line layer 11W via the solder layer 15 and the UBM 14. For example, a connection pad (not illustrated) and UBM (not illustrated) are provided on a connection surface, of the package 12P, to the solder layer 15. The solder layer 15 is coupled to the UBM on the package 12P side. The light-emitting elements 12R, 12G, and 12B in the package 12P are, for example, light-emitting elements that emit respective pieces of light having wavelength ranges that are different from each other, and include an inorganic semiconductor material. For example, the light-emitting element 12R is an LED chip that emits light in a red wavelength range, the light-emitting element 12G is an LED chip that emits light in a green wavelength range, and the light-emitting element 12B is an LED chip that emits light in a blue wavelength range. The light-emitting elements 12R, 12G, and 12B include, for example, an n-type semiconductor layer, a p-type semiconductor layer, an n-type electrode, and a p-type electrode. The light-emitting elements 12R, 12G, and 12B are covered with a protector P. The protector P includes, for example, a resin material or the like.

The protection layer 16 is provided over the entire surface of the substrate 11 so as to cover the plurality of packages 12P. The protection layer 16 is for protecting the package 12P, and includes an insulating organic material, an insulating inorganic material, or the like. Examples of the insulating organic material include silicone. Examples of the insulating inorganic material include a silicon oxide (SiO) and a silicon nitride (SiN).

The first light-absorbing layer 13 is provided on the protection layer 16. The first light-absorbing layer 13 is a so-called black mask. The first light-absorbing layer 13 faces the second light-absorbing layer 11L with, for example, the protection layer 16 and the package 12P therebetween. The openings 13A provided on the first light-absorbing layer 13 are for extracting the pieces of light emitted from the respective packages 12P (the light-emitting elements 12R, 12G, and 12B), and are disposed in regions that face the respective packages 12P. A size of the opening 13A is such that it is possible to extract the pieces of light emitted from the light-emitting elements 12R, 12G, and 12B sufficiently, and is slightly larger than a size of the package 12P in plan view, for example. For example, the first light-absorbing layer 13 includes a resin material containing carbon black, or the like. The first light-absorbing layer 13 may include, for example, a metal material such as titanium (Ti), chromium (Cr), nickel (Ni), tungsten (W), or molybdenum (Mo). A thickness of the first light-absorbing layer 13 is, for example, about 0.1 µm to 10 µm.

(Method of Manufacturing Display Device 1)

It is possible to manufacture the display device 1, for example, by a method described below (FIGS. 3A, 3B, 3C, 4A, and 4B).

First, as illustrated in the FIG. 3A, the wiring line layer 11W is formed on the substrate 11. The Wiring line layer 11W is formed by, for example, forming a film of an electrically conductive material such as copper (Cu) on the entire surface of the substrate 11 and patterning thereof.

Next, as illustrated in FIG. 3B, the insulating layer 11Z and the UBM 14 are formed in this order. The insulating layer 11Z is formed by forming a film of the organic insulating material, the inorganic insulating material, or the like over the entire surface of the substrate 11 so as to cover the wiring line layer 11W. The UBM 14 is formed so as to form a through-hole at a predetermined position of the insulating layer 11Z and to fill the through-hole. The UBM 14 is formed, for example, by protruding from the surface of the insulating layer 11Z.

After the UBM 14 is formed, as illustrated in FIG. 3C, the second light-absorbing layer 11L is formed on the insulating layer 11Z. The second light-absorbing layer 11L is formed with the opening section for exposing the UBM 14.

Subsequently, as illustrated in FIG. 4A, the plurality of packages 12P is mounted on the substrate 11. At this time, the solder layer 15 is formed between the package 12P and the UBM 14.

After mounting the plurality of packages 12P on the substrate 11, as illustrated in FIG. 4B, the protection layer 16 that covers the plurality of packages 12P is formed. Thereafter, the first light-absorbing layer 13 is formed on the protection layer 16. The display device 1 illustrated in FIG. 2 is completed in this manner, for example.

(Operation of Display Device 1)

In the display device 1, for example, when a drive signal is supplied to each of the light-emitting elements 12R, 12G, and 12B through the wiring line layer 11W, the light of the red wavelength range is emitted from the light-emitting element 12R, the light of the green wavelength range is emitted from the light-emitting element 12G, and the light of the blue wavelength range is emitted from the light-emitting element 12B. The pieces of light are extracted through the opening 13A of the first light-absorbing layer 13. That is, in the display device 1, the side on which the first light-absorbing layer 13 is provided serves as a display surface.

(Workings and Effects of Display Device 1)

In the display device 1 according to the present embodiment, the second light-absorbing layer 11L is provided on the wiring line layer 11W side, in addition to the first light-absorbing layer 13 provided on the light-extraction side of the package 12P. That is, the light-absorbing layers (the first light-absorbing layer 13 and the second light-absorbing layer 11L) are provided at an upper layer and a lower layer of the package 12P. Accordingly, it is possible to suppress a reflection of light more effectively than a case where only the first light-absorbing layer 13 is provided. Hereinafter, workings and effects thereof will be described.

FIG. 5 illustrates a schematic cross-sectional configuration of a main part of a display device (a display device 100) according to a comparative example. The display device 100 has the wiring line layer 11W, the insulating layer 11Z, the package 12P, and the first light-absorbing layer 13 in this order on the substrate 11. The package 12P is electrically coupled to the wiring line layer 11W via the solder layer 15 and the UBM 14. The first light-absorbing layer 13 has the opening 13A in a region that faces the package 12P. In the display device 100, no second light-absorbing layer (the second light-absorbing layer 11L in FIG. 2) is provided on the insulating layer 11Z. In this respect, the display device 100 differs from the display device 1 described above.

FIG. 6 illustrates an example of paths of light L emitted from the package 12P of the display device 100. A part of the light (light L1) emitted from the package 12P is extracted from the display surface side through the opening 13A of the first light-absorbing layer 13. Meanwhile, another part of the light (light L2) emitted from the package body 12 is reflected by an upper layer (e.g., an interface formed by the protection layer 16) of the package body 12, and is directed toward the substrate 11 side. The light L2 is reflected again by the substrate 11, the wiring line layer 11W, the insulating layer 11Z, or the like. The light L2 repeatedly reflected in this manner is extracted from the opening 13A that is different from the opening 13A from which the light L1 is extracted, for example. That is, the light L2 serves as a stray light component, which can deteriorate image quality.

In addition, when external light enters the display device 100 through the opening 13A of the first light-absorbing layer 13, the external light is reflected by the substrate 11, the wiring line layer 11W, the insulating layer 11Z, or the like. The reflection of the external light can decrease blight place contrast.

Further, the insulating layer 11Z on which the light L2 or the light external light is incident is liable to be deteriorated. In particular, in the insulating layer 11Z that includes a resin material, migration can be induced by the entering of the light L2. Due to this migration, an insulating property of the insulating layer 11Z is lowered, which can impair reliability of the display device 100.

In contrast, the display device 1 includes the second light-absorbing layer 11L that faces the first light-absorbing layer 13 with the package 12P therebetween. Accordingly, the reflection on the display surface side is suppressed by the first light-absorbing layer 13, and the reflection of the light on the substrate 11 side is suppressed by the second light-absorbing layer 11L.

FIG. 7 illustrates an example of paths of the light emitted from the package 12P of the display device 1. In the display device 1, the light L2 reflected by the upper layer of the package 12 is absorbed by the second light-absorbing layer 11L provided on the insulating layer 11Z. Accordingly, in the display device 1, the deterioration of the image quality caused by the light L2 is suppressed.

In addition, even if the external light enters the display device 1 through the opening 13A of the first light-absorbing layer 13, the external light is absorbed by the second light-absorbing layer 11L. In particular, the external light is effectively absorbed in a case where the second light-absorbing layer 11L is provided in the region that faces the opening 13A. Accordingly, the decrease in the blight place contrast caused by the reflection of the external light on the substrate 11 side is suppressed.

Further, the insulating layer 11Z is covered with the second light-absorbing layer 11L in the display device 1. Thus the deterioration of the insulating layer 11Z caused by the entering of the light to the insulating layer 11Z is suppressed. For example, the migration is less likely to occur in a case where the insulating layer 11Z includes the resin material. Accordingly, the insulating property of the insulating layer 11Z is maintained, making it possible to maintain the reliability of the display device 1.

As described above, in the present embodiment, the second light-absorbing layer 11L is provided that faces the first light-absorbing layer 13 with the light-emitting elements 12R, 12G, and 12B therebetween. Thus, it is possible to suppress the reflection of the light more effectively as compared with a case where only the first light-absorbing layer 13 is provided (the display device 100). Hence, it is possible to improve the image quality.

In addition, the second light-absorbing layer 11L suppresses the reflection of the external light on the substrate 11 side. Hence, it is possible to improve the blight place contrast.

Further, the insulating layer 11Z is covered with the second light-absorbing layer 11L. Thus, the deterioration of the insulating layer 11Z due to the entering of the light to the insulating layer 11Z is suppressed. Hence, it is possible to improve the reliability of the display device 1.

Hereinafter, other embodiments and modification examples will be described. In the following description, the same components as those of the embodiment described above are denoted by the same reference numerals, and description thereof will be omitted as appropriate.

<Second Embodiment>

(A) and (B) of FIG. 8A schematically illustrates a configuration of a main part of a display device (a display device 2) according to a second embodiment of the present technology. FIG. 8A illustrates a cross-sectional configuration of the main part of the display device 2, and FIG. 8B illustrates a planar configuration corresponding to FIG. 8A. In the display device 2, the second light-absorbing layer 11L is provided in contact with the wiring line layer 11W. Except for this point, the display device 2 according to the second embodiment has the similar configuration and effects to the display device 1 of the first embodiment described above.

The display device 2 has the wiring line layer 11W, the second light-absorbing layer 11L, the insulating layer 11Z, the package 12P, and the first light-absorbing layer 13 in this order on the substrate 11. The package 12P is electrically coupled to the wiring line layer 11W via the solder layer 15 and the UBM 14. The UBM 14 is provided so as to be exposed from the surface of the second light-absorbing layer 11L, and is buried in the connection hole that penetrates the insulating layer 11Z.

The second light-absorbing layer 11L is provided between the wiring line layer 11W and the insulating layer 11Z, and is in contact with the wiring line layer 11W and the insulating layer 11Z. The second light-absorbing layer 11L includes, for example, a resin material containing carbon black. The second light-absorbing layer 11L may include, for example, a metal material such as titanium (Ti), chromium (Cr), nickel (Ni), tungsten (W), or molybdenum (Mo). Alternatively, the second light-absorbing layer 11L may be configured by a plating film such as nickel (Ni) plating or copper (Cu) plating. Alternatively, the second light-absorbing layer 11L may be configured by a roughened layer. The roughened layer is formed, for example, by subjecting a surface of the wiring line layer 11W to a roughening process such as a wet etching process.

The second light-absorbing layer 11L has, for example, the same planar shape as the wiring line layer 11W. The second light-absorbing layer 11L is disposed, for example, in a region including a region that faces the opening 13A of the first light-absorbing layer 13. The second light-absorbing layer 11L is separated, for example, by a gap S (a first gap) together with the wiring line layer 11W.

FIGS. 9A and 9B schematically illustrate examples of a planar configuration of the gap S of the second light-absorbing layer 11L and the wiring line layer 11W. The gaps S of the second light-absorbing layer 11L and the wiring line layer 11W may extend, for example, in directions that intersect with each other (an X direction and a Y direction in FIG. 9A). That is, the gaps S may be provided in a grid shape in plan view. Alternatively, the gap S of the second light-absorbing layer 11L and the wiring line layer 11W may extend along one direction (the Y direction in FIG. 9B). That is, the gap S may be provided in a belt shape in plan view.

It is preferable that the light-emitting elements 12R, 12G, and 12B (the package 12P) be provided at a position that faces at least a portion of the gap S provided on the second light-absorbing layer 11L and the wiring line layer 11W. In a case where the second light-absorbing layer 11L has the lattice-shaped gap S in plan view, the light-emitting elements 12R, 12G, and 12B are preferably arranged at a position that faces the vicinity of an intersection of the gaps S. In other words, it is preferable that the light-emitting elements 12R, 12G, and 12B be disposed at a position overlapping at least a portion of the gap S in plan view. This makes it difficult to cause a reflection of light on the substrate 11 side attributed to the gap S.

The second light-absorbing layer 11L may have a gap (a gap SA of FIG. 10 to be described later) provided on the wiring line layer 11W, in addition to the gap S common with the wiring line layer 11W.

FIG. 10 illustrates an example of a configuration of the gap SA (a second gap) selectively provided on the second light-absorbing layer 11L, out of the wiring line layer 11W and the second light-absorbing layer 11L. The wiring line layer 11W is exposed from the gap SA of the second light-absorbing layer 11L. Providing the gap SA on the second light-absorbing layer 11L in this manner suppresses a decrease in adherence of the wiring line layer 11W. A reason for this will be described below.

In a case where the second light-absorbing layer 11L is provided in contact with the wiring line layer 11W, a stress applied to the wiring line layer 11W is increased, making it easier for the wiring line layer 11W to be peeled off from the substrate 11. In particular, the stress applied to the wiring line layer 11W becomes large in a case where the second light-absorbing layer 11L includes a metal material. Because the stress applied to the wire 11W is reduced by separating the second light-absorbing layer 11L by the gap SA, it is possible to suppress the decrease in the adherence of the wiring line layer 11W caused by the second light-absorbing layer 11L.

It is preferable that the gap SA be provided at a position excluding a position that faces the UBM 14. For example, by providing the second light-absorbing layer 11L that includes a metal material between the UBM 14 and the wiring line layer 11W, a solder material is prevented from diffusing from the solder layer 15. A reason for this will be described below.

FIG. 11 schematically illustrates grains (grains G1) generated in the UBM 14 and grains (grains G2) generated in the second light-absorbing layer 11L. Because the grains G1 of the UBM 14 and the grains G2 of the second light-absorbing layer 11L are formed in different stages, the grains G1 and G2 are discontinuous. Accordingly, the solder material from the solder layer 15 is less likely to diffuse into the wiring line layer 11W or the like through the grains G1 and G2. Hence, it is possible for the display device 2 to suppress a decrease in reliability caused by the diffusion of the solder material from the solder layer 15.

It is possible to manufacture the display device 2, for example, by a method described below (FIGS. 12A and 12B).

First, the wiring line layer 11W is formed on the substrate 11 in a manner similar to that described with reference to the display device 1 (FIG. 3A) described above.

Next, as illustrated in FIG. 12A, the second light-absorbing layer 11L is formed on the wiring line layer 11W. For example, the second light-absorbing layer 11L is formed by, for example, applying a roughening process to a surface of the wiring line layer 11W. Alternatively, films of an electrically conductive film for forming the wiring line layer 11W and a metal film for forming the second light-absorbing layer 11L are continuously formed in this order on the substrate 11, following which the metal film and the electrically conductive film may be patterned using the same mask. In such a formation step of the second light-absorbing layer 11L, it is not necessary to add a new patterning step as compared with a manufacturing step of a case where no second light-absorbing layer 11L is provided (for example, the display device 100 in FIG. 5). Accordingly, it is possible to form the second light-absorbing layer 11L easily.

After the second light-absorbing layer 11L is formed, as illustrated in FIG. 12B, the insulating layer 11Z and the UBM 14 are formed in this order. The insulating layer 11Z is formed, for example, by forming a film of an organic insulating material, an inorganic insulating material, or the like over the entire surface of the substrate 11 so as to cover the second light-absorbing layer 11L. The UBM 14 is formed so as to be exposed from the surface of the insulating layer 11Z.

After the UBM 14 is formed, the plurality of packages 12P is mounted on the substrate 11. At this time, the package 12P is coupled to the UBM 14 via the solder layer 15. Here, the second light-absorbing layer 11L is provided on the substrate 11. As a result, the second light-absorbing layer 11L efficiently absorbs the red external light in a reflow process upon solder bonding, improving a thermal utilization efficiency in the reflow process. Accordingly, it is possible to enhance stability of the bonding that uses the solder layer 15.

After mounting the plurality of packages 12P on the substrate 11, the protection layer 16 and the first light-absorbing layer 13 are formed in this order. In this manner, the display device 2 illustrated in FIGS. 8A and 8B is completed.

As in the present embodiment, the second light-absorbing layer 11L may be provided in contact with the wiring line layer 11W. Also in this case, it is possible to achieve effects equivalent to those of the first embodiment described above.

<Modification Example>

FIGS. 13A and 13B illustrate a schematic cross-sectional configuration of a main part of a display device (a display device 2A) according to a modification example of the second embodiment described above. In this manner, a light-absorbing layer (a third light-absorbing layer 11LA) may be further provided between the substrate 11 and the wiring line layer 11W. Except for this point, the display device 2A according to the present modification example has a configuration and effects similar to those of the display device 2 according to the second embodiment described above.

The display device 2A has, for example, a wiring line layer 11WA, the third light-absorbing layer 11LA, and an insulating layer 11ZA in this order from the substrate 11 side, between the substrate 11 and the wiring line layer 11W.

The wiring line layer 11WA is provided in a selective region on the substrate 11. The wiring line layer 11WA includes, for example, a metal material such as copper (Cu) or aluminum (Al). The metal material may be a single body, or may be an alloy. The wiring line layer 11WA may include a light-transmitting, electrically conductive material such as ITO (Indium Tin Oxide).

The third light-absorbing layer 11LA is provided between the wiring line layer 11WA and the insulating layer 11ZA, and is in contact with the wiring line layer 11WA and the insulating layer 11ZA. The third light-absorbing layer 11LA includes, for example, a resin material containing carbon black. The third light-absorbing layer 11LA may include, for example, a metal material such as titanium (Ti), chromium (Cr), nickel (Ni), tungsten (W), or molybdenum (Mo). Alternatively, the third light-absorbing layer 11LA may be configured by a plating film such as nickel (Ni) plating or copper (Cu) plating. Alternatively, the third light-absorbing layer 11LA may be configured by a roughened layer. The roughened layer is formed, for example, by subjecting a surface of the wiring line layer 11WA to a roughening process such as a wet etching process.

The third light-absorbing layer 11LA may be provided in a selective region on the wiring line layer 11WA (FIG. 13A) or may have the same planar shape as the wiring line layer 11WA (FIG. 13B).

As illustrated in FIG. 13A, the third light-absorbing layer 11LA is disposed, for example, in a region that faces the gap S of the wiring line layer 11WA and the second light-absorbing layer 11L. Providing the third light-absorbing layer 11LA in the region that faces the gap S makes it difficult to cause a reflection of light on the substrate 11 side attributed to the gap S.

Alternatively, as illustrated in FIG. 13B, a portion of the second light-absorbing layer 11L and a portion of the third light-absorbing layer 11LA may be provided so as to overlap each other in a plan (the X-Y plane in FIG. 13B) view. In other words, the second light-absorbing layer 11L and the third light-absorbing layer 11LA have overlapping regions. As a result, the light directed toward the substrate 11 side is absorbed by one of the second light-absorbing layer 11L and the third light-absorbing layer 11LA, making it difficult to cause a reflection of light on the substrate 11 side.

At this time, for example, one package 12P may be coupled to the second light-absorbing layer 11L and the third light-absorbing layer 11LA (FIG. 13B). For example, the package 12P and the second light-absorbing layer 11L are coupled by the solder layer 15 and the UBM 14, and the package 12P and the third light-absorbing layer 11LA are coupled by the solder layer 15, the UBM 14, and a through electrode 11E. The through electrode 11E is provided in a connection hole that penetrates the insulating layer 11ZA and the third light-absorbing layer 11LA.

Out of the wiring line layer 11LA and the third light-absorbing layer 11LA, the gap SA may be provided on the third light-absorbing layer 11LA (see FIG. 10). As a result, the stress applied to the wiring line layer 11LA is reduced, making it possible to suppress the decrease in the adherence of the wiring line layer 11LA.

The insulating layer 11ZA is provided, for example, on the entire surface of the substrate 11 so as to cover the third light-absorbing layer 11LA and the wiring line layer 11WA. The insulating layer 11ZA includes, for example, an organic insulating material or an inorganic insulating material.

As in the present modification example, the third light-absorbing layer 11LA may be provided between the substrate 11 and the wiring line layer 11W. Also in this case, it is possible to achieve effects equivalent to those of the second embodiment described above. Further, because the third light-absorbing layer 11LA is provided together with the second light-absorbing layer 11L on the substrate 11 side, the reflection on the substrate 11 side is suppressed more effectively than in the display device 2 described above.

<Other Modification Examples>

Although the present technology has been described with reference to the embodiments and the modification example, the present technology is not limited to these embodiments and the like, and various modifications are possible. For example, a material and a thickness of each part described in the above embodiment and the like are not limited, and other materials and thicknesses may be used.

Further, in the above-described embodiment and the like, an example in which one package 12P includes three light-emitting elements (the light-emitting elements 12R, 12G, and 12B) has been described, but a form of the package 12P is not limited to this example.

FIGS. 14A and 14B illustrate other examples of the package 12P. As illustrated in FIG. 14A, one package 12P may include one light-emitting element (e.g., any one of the light-emitting elements 12R, 12G, and 12B), and one package 12P may include four or more light-emitting elements as illustrated in FIG. 14B. The four or more light-emitting elements include, for example, light-emitting elements 12R, 12G, 12B, and 12Y. The light-emitting element 12Y emits, for example, light in a yellow wavelength range. The number and colors of the light-emitting elements contained in one package 12P are not limited to these examples.

In addition, in FIGS. 13A and 13B, the third light-absorbing layer 11LA is exemplified as a modification example of the display device 2 described above. However, the display device 1 described above may have the third light-absorbing layer 11LA. Specifically, the third light-absorbing layer 11LA may be provided between the substrate 11 and the wiring line layer 11L in FIG. 2.

The display device 1, 2, and 2A described in the above-described embodiments and the like may be a display device in which the multiple substrates 11 are tiled, i.e., may be a so-called tiling display.

<Application Example>

It is possible to apply any of the display devices 1, 2, and 2A described in the above-described embodiments and the like to, for example, an electronic device in any field that displays, as an image or a picture, a picture signal inputted from the outside or a picture signal generated internally, such as a television device, a digital camera, a notebook personal computer, a portable terminal device such as a mobile phone, or a video camera, for example.

Note that the effects described in this specification are merely exemplary and are not limited thereto, and other effects may be achieved.

It is to be noted that the present technology may also be configured as below. According to the display device having the following configuration, the second light-absorbing layer is provided that faces the first light-absorbing layer with the light-emitting element therebetween. Thus, it is possible to more effectively suppress the reflection of the light as compared with a case where only the first light-absorbing layer is provided. Hence, it is possible to improve the image quality.

(1)
A display device including:
a plurality of light-emitting elements;
a first light-absorbing layer having an opening at a position that faces the light-emitting elements; and
a second light-absorbing layer that faces the first light-absorbing layer with the light-emitting elements therebetween.

(2)
The display device according to (1), in which the second light-absorbing layer is disposed in a region including a region that faces the opening of the first light-absorbing layer.

(3)
The display device according to (1) or (2), further including:
a substrate; and
a wiring line layer provided between the substrate and the second light-absorbing layer.

(4)
The display device according to (3), further including an insulating layer provided between the wiring line layer and the second light-absorbing layer.

(5)
The display device according to (3), in which the second light-absorbing layer is in contact with the wiring line layer.

(6)
The display device according to (5), in which the second light-absorbing layer is separated by a first gap.

(7)
The display device according to (6), in which the light-emitting elements are disposed at a position that faces at least a portion of the first gap.

(8)
The display device according to any one of (5) to (7), further including UBM (Under Bump metal) provided between the second light-absorbing layer and the light-emitting elements, in which the second light-absorbing layer includes a metal material.

(9)
The display device according to any one of (5) to (8), in which, out of the wiring line layer and the second light-absorbing layer, the second light-absorbing layer has a second gap selectively provided on the second light-absorbing layer.

(10)
The display device according to (3), in which the second light-absorbing layer has a planar shape that is same as a planar shape of the wiring line layer.

(11)
The display device according to any one of (3) to (10), further including a third light-absorbing layer provided between the substrate and the wiring line layer.

(12)
The display device according to any one of (1) to (11), in which the second light-absorbing layer includes a resin material or a metal material.

(13)
The display device according to any one of (1) to (12), in which the light-emitting elements include an inorganic semiconductor material.

The present application claims the benefit of Japanese Priority Patent Application JP2018-190984 filed with the Japan Patent Office on Oct. 9, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A display device comprising:
   a substrate;
   a plurality of light-emitting elements;
   a first light-absorbing layer having an opening at a position that faces the plurality of light-emitting elements; and
   a second light-absorbing layer that faces the first light-absorbing layer with the plurality of light-emitting elements therebetween;
   a wiring line layer between the substrate and the second light-absorbing layer; and
   an insulating layer between the wiring line layer and the second light-absorbing layer.

2. The display device according to claim 1, wherein the second light-absorbing layer is disposed in a region including a region that faces the opening of the first light-absorbing layer.

3. The display device according to claim 1, further comprising a third light-absorbing layer provided between the substrate and the wiring line layer.

4. The display device according to claim 1, wherein the second light-absorbing layer includes a resin material or a metal material.

5. The display device according to claim 1, wherein the plurality of light-emitting elements include an inorganic semiconductor material.

6. A display device, comprising:
   a substrate;
   a plurality of light-emitting elements;
   a first light-absorbing layer having an opening at a position that faces the plurality of light-emitting elements;
   a second light-absorbing layer that faces the first light-absorbing layer with the plurality of light-emitting elements therebetween;
   a wiring line layer between the substrate and the second light-absorbing layer, wherein the second light-absorbing layer is in contact with the wiring line layer; and
   an Under Bump Metal (UBM) between the second light-absorbing layer and the plurality of light-emitting elements.

7. A display device, comprising:
   a substrate;
   a plurality of light-emitting elements;
   a first light-absorbing layer having an opening at a position that faces the plurality of light-emitting elements;
   a second light-absorbing layer that faces the first light-absorbing layer with the plurality of light-emitting elements therebetween;
   a wiring line layer between the substrate and the second light-absorbing layer; and
   a third light-absorbing layer between the substrate and the wiring line layer.

8. The display device according to claim 7, wherein the second light-absorbing layer is separated by a gap.

9. The display device according to claim 8, wherein the plurality of light-emitting elements are at a position that faces at least a portion of the gap.

* * * * *